(12) United States Patent
Vaez-Iravani et al.

(10) Patent No.: US 10,510,624 B2
(45) Date of Patent: Dec. 17, 2019

(54) METROLOGY SYSTEMS WITH MULTIPLE DERIVATIVE MODULES FOR SUBSTRATE STRESS AND DEFORMATION MEASUREMENT

(71) Applicant: Applied Materials, Inc., Santa Clara, CA (US)

(72) Inventors: Mehdi Vaez-Iravani, Los Gatos, CA (US); Todd Egan, Fremont, CA (US); Samer Banna, San Jose, CA (US); Kyle Tantiwong, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/080,102

(22) PCT Filed: Mar. 9, 2017

(86) PCT No.: PCT/US2017/021638
§ 371 (c)(1),
(2) Date: Aug. 27, 2018

(87) PCT Pub. No.: WO2017/172324
PCT Pub. Date: Oct. 5, 2017

(65) Prior Publication Data
US 2019/0057910 A1    Feb. 21, 2019

Related U.S. Application Data

(60) Provisional application No. 62/314,956, filed on Mar. 29, 2016.

(51) Int. Cl.
*G01B 11/24*    (2006.01)
*H01L 21/66*    (2006.01)
*G02B 27/12*    (2006.01)

(52) U.S. Cl.
CPC .............. *H01L 22/12* (2013.01); *G01B 11/24* (2013.01); *G02B 27/123* (2013.01)

(58) Field of Classification Search
CPC ....... H01L 22/12; G01B 11/24; G02B 27/123; G02B 27/14
See application file for complete search history.

(56) References Cited

U.S. PATENT DOCUMENTS 3,561,876 A * 2/1971 Hoffman ............ G01B 9/02097
356/495
3,849,003 A * 11/1974 Velzel ...................... G01B 9/02
356/495

(Continued)

FOREIGN PATENT DOCUMENTS

WO        2015121853 A1    8/2015

OTHER PUBLICATIONS

International Search Report and Written Opinion dated Jun. 19, 2017 for Application No. PCT/US2017/021638.

*Primary Examiner* — Hwa Andrew Lee
(74) *Attorney, Agent, or Firm* — Patterson + Sheridan, LLP

(57) ABSTRACT

Embodiments of the disclosure provide a metrology system. In one example, a metrology system includes a laser source adapted to transmit a light beam, a lens adapted to receive at least a portion of the light beam from the laser source, a first beam splitter positioned to receive at least the portion of the light beam passing through the lens, a first beam displacing device adapted to cause a portion of the light beam received from the beam splitter to be split into two or more sub-light beams a first recording device having a detection surface, and a first polarizer that is positioned between the first displacing device and the first recording device, wherein the first polarizer is configured to cause the two or more sub-light beams provided from the first displacing (Continued)

device to form an interference pattern on the detection surface of the first recording device.

14 Claims, 6 Drawing Sheets

(56) References Cited

U.S. PATENT DOCUMENTS

| | | | | |
|---|---|---|---|---|
| 3,958,884 A * | 5/1976 | Smith | ............... | G01B 9/02058 356/495 |
| 4,358,201 A * | 11/1982 | Makosch | ............ | G01B 11/306 356/495 |
| 5,017,012 A * | 5/1991 | Merritt, Jr. | ........... | G01B 11/306 356/600 |
| 5,067,817 A | 11/1991 | Glenn | | |
| 5,392,116 A * | 2/1995 | Makosch | ........... | G01B 11/0608 356/495 |
| 5,469,259 A * | 11/1995 | Golby | ............... | G01B 9/02019 356/495 |
| 6,639,683 B1 * | 10/2003 | Tumbar | ................... | G01J 9/02 356/494 |
| 6,741,357 B2 | 5/2004 | Wang et al. | | |
| 2001/0010591 A1 * | 8/2001 | Kusaka | ................... | G01B 9/04 359/371 |
| 2002/0126292 A1 * | 9/2002 | Rushford | ............ | G01B 11/065 356/492 |
| 2004/0207849 A1 * | 10/2004 | Nikoonahad | ....... | G03F 7/70633 356/401 |
| 2012/0176622 A1 * | 7/2012 | Kudenov | ................. | G01J 4/04 356/491 |
| 2013/0286403 A1 | 10/2013 | Matsubara et al. | | |
| 2014/0320865 A1 | 10/2014 | Knuttel | | |

* cited by examiner

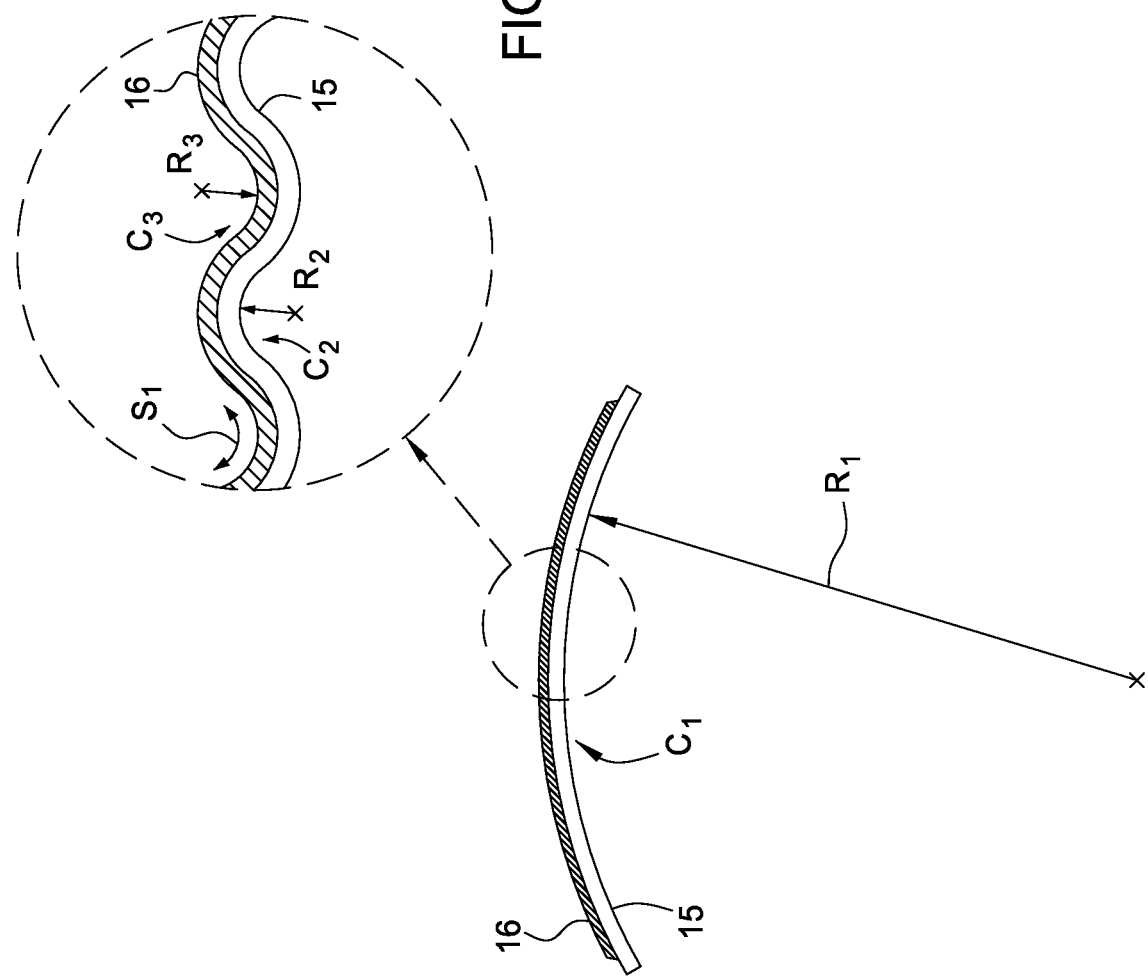

METROLOGY SYSTEMS WITH MULTIPLE DERIVATIVE MODULES FOR SUBSTRATE STRESS AND DEFORMATION MEASUREMENT

BACKGROUND OF THE DISCLOSURE

Field of the Disclosure

Embodiments of the disclosure generally relate to a metrology system and method of using the same, more specifically to methods and a system for measuring the deformed state of a substrate due to stress induced during processing.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the previous one, the individual patterns of the one layer and the next layer must be aligned. However, due to pattern and material differences in the multiple overlying layers, film stress and/or topography variations (or pattern related differences) between layers are inevitable. The generated film stress between the layers formed on the substrate will cause the substrate to deform, which can lead to device yield issues for the semiconductor devices formed on the substrate. Film stress, substrate curvature, or surface topography variations of the device structure on the substrate may also result in displacement or misalignment of the lithographic patterns formed from one layer to the next, which may be detrimental to device yield results and/or cause variation in device performance.

FIGS. 6A-6B depict an example of a film layer 16 disposed on a substrate 15 which may be locally or globally deformed, or curved, after a sequence of device formation processes. In FIG. 6A, the substrate 15 is deformed and curved, such that it has a curvature C1 globally across the back surface of the substrate 15 that has a first radius R1. In addition to the global back surface curvature C1, local areas of the film layer 16 along with the substrate 15 may be deformed, which creates localized curvatures C2-C3 in the substrate that are different from the back surface curvature C1. For example, in a close-up view of the local structures formed on the substrate 15, which are depicted in FIG. 6B, the substrate 15 has a varying curvature due to the pattern and residual stress formed within and/or between the film layer 16 and the substrate 15. The residual stress may be created during substrate processing steps due to differences in thermal expansion, plasma non-uniformity distribution and/or plasma density during a plasma etching or plasma deposition processes, which results in the localized deformation of the substrate surface. The localized deformation of the substrate surface may thus create the localized curvature C2 that has a second radius R2, which is different from the first radius R1 of the global surface curvature C1. The localized curvature C2 may also cause or be adjacent to an uneven surface region of the film layer 16 disposed on the substrate 15, leading to a localized curvature C3 that has a third radius R3 that may all be created by a stress S1 formed in the film layer 16. In the situation where the substrate 15 has a global curvature C1, conventional lithography processes have minimized the effect of the global curvature C1 on semiconductor device yield by clamping or restraining the substrate to a substrate support using a substrate holding device, such as an electrostatic chuck. However, in most of the situations, the process of clamping or restraining a substrate is not effective in reducing the localized curvatures C2-C3 formed in the substrate.

Moreover, with the push to shrink the critical dimensions (CD) of semiconductor devices formed on the substrate, film stress/strain variations in the critical layers of the device structure must be minimized or eliminated in order to reliably produce devices that are nanometers in size. Thus, measuring film stress or topography variations formed on the substrate has become more important in order to seek a proper solution to the localized curvature variations.

Therefore, since the localized curvature formed in a substrate can have a dramatic effect on the ability to reliably form the next generation of semiconductor devices, which have smaller device feature sizes, there is a need for a system and method for detecting the localized deformation of a semiconductor substrate which can be used to adjust or correct the localized deformation in the substrate.

SUMMARY

Embodiments of the disclosure provide methods and system for measuring film stress or topography variations on a semiconductor substrate by analyzing wavefront reflected from a back surface of the semiconductor substrate. In one embodiment, a metrology system includes a laser source adapted to transmit a light beam, a lens adapted to receive at least a portion of the light beam from the laser source, a first beam splitter positioned to receive at least a portion of the light beam passing through the lens, a first beam displacing device adapted to cause a portion of the light beam received from the beam splitter to be split into two or more sub-light beams that are displaced a distance apart from each other, a first recording device having a detection surface, and a first polarizer that is positioned between the first displacing device and the first recording device, wherein the first polarizer is configured to cause the two or more sub-light beams provided from the first displacing device to form an interference pattern on the detection surface of the first recording device.

In another embodiment, a metrology system includes a laser source adapted to provide a light beam, a first beam splitter, and a pair of derivative modules adapted to receive the light beam split from the beam splitter generated from the laser source, wherein each of the derivative module comprises a beam displacing device, a recording device, and a polarizer disposed between the beam displacing device and the recording device.

In yet another embodiment, a method detecting the non-planarity of a surface of a substrate includes emitting a light beam from a laser source through a lens to a region of a back surface of a substrate, receiving at least a portion of the emitted light beam at a recording device, wherein the portion of the emitted light beam is received after being reflected from the back surface of the substrate, transmitted through or reflected from a beam splitter, and transmitted through a beam displacing device and a polarizer, and the portion of the emitted light beam received by the recording device comprises an interference pattern that is detected by the recording device, and analyzing the detected interference pattern to determine the slope of a portion of the surface of substrate within the region of the substrate.

Embodiments of the disclosure may further provide a method detecting the non-planarity of a surface of a substrate by emitting a light beam from a laser source through a lens to a region of a back surface of a substrate, and then receiving at least a portion of the emitted light beam at a recording device, wherein the portion of the emitted light beam is received after being reflected from the back surface of the substrate, transmitted through or reflected from a beam splitter, and transmitted through a beam displacing device and a polarizer. The portion of the emitted light beam received by the recording device will include an interference pattern that is detected by the recording device. The detected interference pattern is then analyzed to determine the slope of a portion of the surface of substrate within the region of the substrate. The method may further include determining the curvature of the portion of the surface of substrate based on the analysis of the detected interference pattern. The method may also include delivering an amount of energy to a portion of the substrate to adjust the slope of the portion of the substrate based on the analysis of the detected interference pattern.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

FIGS. 6A-6B depict a cross sectional view of a substrate with curvature formed in the substrate.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure describe a metrology system for measuring the amount of deformation found within a substrate. The metrology system may be adapted to detect the variation in the slope across various regions of the surface of the substrate. In one embodiment, the film deflection, stress or surface topography variations may be measured by collecting differential images of the reflected wavefront reflected from a surface of a substrate, such as the back surface of a substrate, prior to and/or after a film layer is formed on the substrate.

In some embodiments, the wavefront reflected from a substrate that is being inspected by the metrology system is split into two orthogonally (e.g., X and Y directions) polarized wavefronts by a beam-displacing device, such as a calcite beam-displacer. The two directional polarized wavefronts are then caused to interfere by use of a polarizer. A recording device (e.g., a camera) is then utilized to detect the interfering wavefronts in two directions to generate a local two dimensional slope map that indicates the stress or deformation profile of the substrate. Different configurations of the metrology systems may be utilized to obtain more accurate localized two dimensional or three dimensional topographic, deflection, or stress profiles of the substrate.

Figure 1:
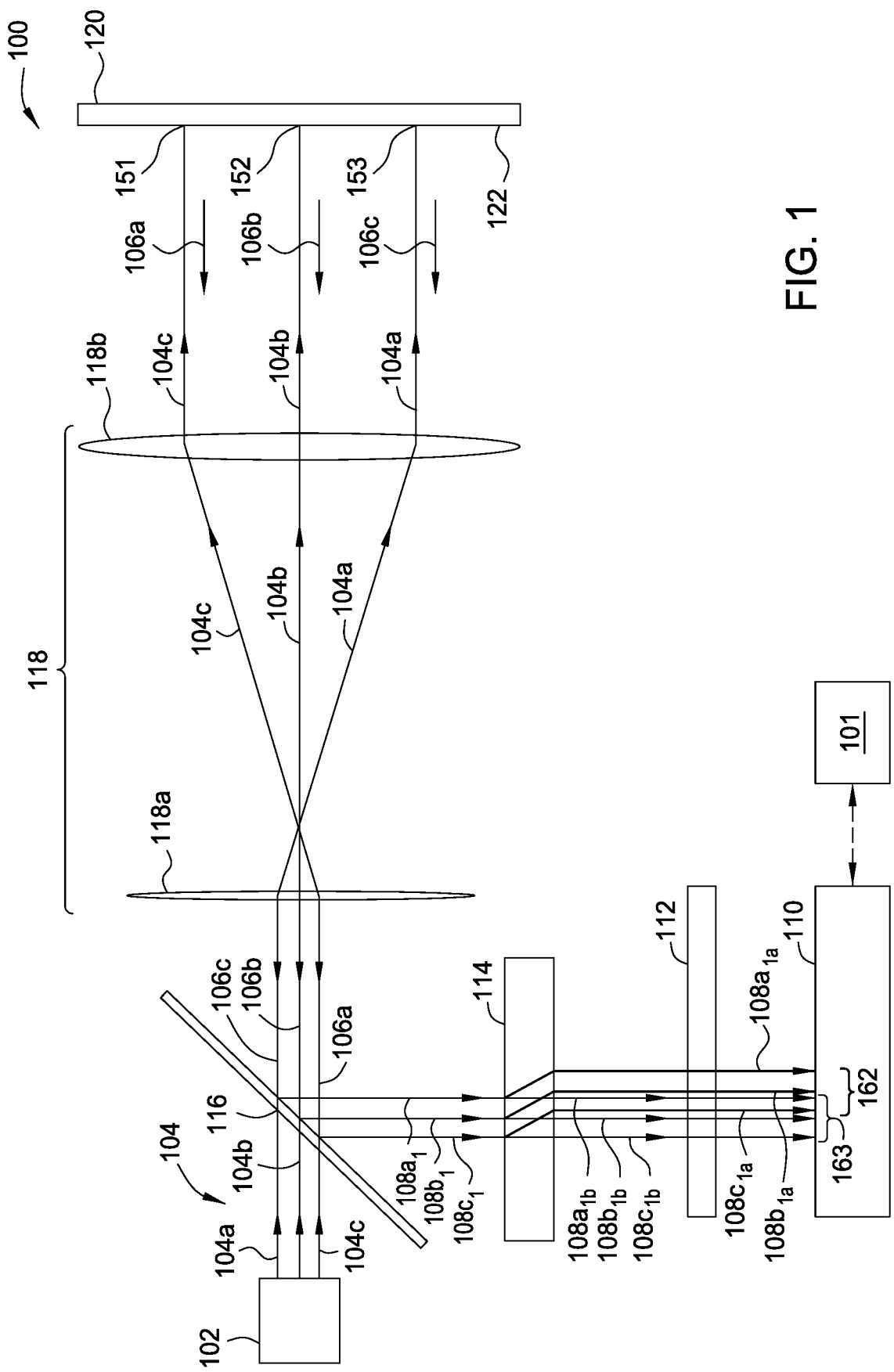
FIG. 1 depicts a metrology system that may be utilized to measure the deflection of a substrate according to an embodiment of the disclosure.

FIG. 1 depicts one configuration of a metrology system 100 that may be utilized to measure stress, surface slope and/or local deformation of a semiconductor substrate 120. The metrology system 100 includes a laser collimator 102 that may provide one or more beams of light (e.g., coherent electromagnetic radiation) that is directed onto a target object, such as the semiconductor substrate 120. In some embodiments, the laser collimator 102 transmits a light beam 104 (shown as 104a, 104b, 104c) towards the semiconductor substrate 120 through a pair of lenses 180 (shown as a first lens 118a and a second lens 118b), such as a pair of lenses found in a telescopic type device, disposed therebetween. In one example, the laser collimator 102 may be a relatively short coherence laser that emits a beam of light that has a relatively short coherence length, so as to ensure that unwanted coherence noise factors, such as unavoidable scattering from dust and other inclusions, are efficiently reduced.

The emitted light beam 104 passes through the first lens 118a which expands the light beam 104 to yield an expanded light beam (shown as rays 104a, 104b, 104c) towards the second lens 118b. After passing through the second lens 118b, the expanded light beam 104a, 104b, 104c is then delivered across a surface 122 of semiconductor substrate 120. Based on the adjustment of the optics, angle, position of the lenses 118a, 118b or distance between the lenses 118a, 118b and tilt angle of the semiconductor substrate 120, different degrees of focus, convergence, divergence, reflected light beam angle from the substrate 120 or other desired optical attributes of the light beam 104 may be obtained.

After the light beam 104a, 104b, 104c reaches the surface 122 of the semiconductor substrate 120, the light beam 104a, 104b, 104c is then reflected off of the semiconductor substrate 120, generating a returning light beam 106a, 106b, 106c that is transmitted back through the lenses 118b, 118a. It is noted that the surface 122 of the semiconductor substrate 120 may be a front surface (e.g., a surface with device patterns formed thereon) or a back surface of the semiconductor substrate 120. In the example depicted in FIG. 1, the surface 122 is a back surface of the semiconductor substrate 120. It is also noted that although the semiconductor substrate 120 depicted in FIG. 1 is positioned in a substantially vertical position, the semiconductor substrate 120 and metrology system 100 may alternately be oriented such that the semiconductor substrate 120 is in a horizontal orientation. However, the metrology system 100 is also generally configured so that it is able to reliably perform the measurement process if the semiconductor substrate 120 is positioned at a slight angle relative to the incoming light beam 104a, 104b, 104c. In general, the angle of the semiconductor substrate 120 to the incoming light beam 104a, 104b, 104c needs to be an angle that is less than or equal to an angle that allows the returning light beam 106a, 106b, 106c to be captured by the lenses 118a and 118b. By doing so, light beams reflected from substantially all locations, including edges of the image field, of the semiconductor substrate 120 may also be obtained and analyzed so as to provide more accurate analysis to the localized deflection and surface slope profile as needed.

After the returning light beam 106a, 106b, 106c passes through the lens 118b, 118a, it is delivered to a beam splitter 116. The beam splitter 116 redirects at least a portion of the returning light beam 106a, 106b, 106c to form a set of reference beams, e.g., reference beam 108a1, 108b1, 108c1. The set of reference beams 108a1, 108b1, 108c1 all ultimately impinge on a recording device 110 included in the metrology system 100. Suitable examples of the recording device 110 include infrared photographic film, infrared thermo-plastic record, a photon detecting electronic device, such as CCD device, or other similar electromagnetic radiation image detecting devices.

The reference beam $108a_1$, $108b_1$, $108c_1$ that is reflected from the beam splitter 116 then passes through a beam-displacing device 114, such as a calcite beam-displacer. The beam displacing device 114 may polarize and separate the reference beam $108a_1$, $108b_1$, $108c_1$ into two orthogonally polarized wavefronts that include the same optical data (e.g., image) and are spaced a distance from each other. For example, the reference beam $108a_1$, $108b_1$, $108c_1$ is further split into two sub-set wavefronts 162, 163, including a first sub-set wavefront 162 (shown as $108a_{1a}$, $108b_{1a}$, $108c_{1a}$) and a second sub-set wavefront 163 (shown as $108a_{1b}$, $108b_{1b}$, $108c_{1b}$).

A polarizer 112 is then placed in front of the recording device 110 to cause the sub-set wavefronts 162, 163 passing therethrough to interfere. The recording device 110 has a detection surface that receives the interfering wavefronts (e.g., interference patterns) at an image plane (e.g., the detection surface) and then generates a signal that can be analyzed by a computing device 101 found within the metrology system 100 to compute and determine a deformation distribution substrate map. The sub-set wavefronts 162, 163 are thus used to determine details of the localized topography or deflection of the semiconductor substrate 120. As the sub-set wavefronts 162, 163 are differentiated just prior to being received by the recording device 110 by use of the polarizer 112, resolution and informational data that the light beam needs to contain in the metrology system 100 is highly reduced over conventional metrology techniques that do not use a differential measurement technique, and thus the metrology system 100 described herein allows a much smaller and less costly metrology system 100 to be used over conventional designs today. The relative nature of this measurement concept enables use of non-ideal, lower-cost opto-mechanical components as changes in fringe spacing as a function of changes in film stress are utilized herein, as opposed to a conventional system which tries to measure absolute spacing as a function of absolute film stress.

One will note that the metrology system's computing device, which is discussed above, may include a processor (not shown), non-volatile memory (not shown), display (not shown), software programs stored in the non-volatile memory and I/O elements (not shown) that interconnect these various electrical components. However, the metrology system's computing device can also include any other form of industrial computing device that is used today or in the future. The memory can include non-transitory memory that can host an application, which, when executed by the processor, can instruct the components of the metrology system 100 to perform the methods described herein.

The computing device 101 may perform a before-and-after measurement comparison (e.g., before and/or after a film layer is formed on the substrate) of the substrate surfaces so as to determine the substrate profile after a film layer is formed on the substrate surface. After performing the comparison and calculation, an image (e.g., or a profile map) can then be generated based on the computation of the interfering image as obtained from the recording device 110 to indicate the local deflection, slope of the localized substrate surface, substrate stress or surface topography of the substrate surface, so as to determine if a repair process is required to correct or adjust local stress/surface topography on the substrate surface. If so, a stress relief process, surface topography repair process, or localized surface slope alternation process may be performed, based on the image (e.g., the profile map) analyzed and computed by the computing device 101. In one example, the interfering image detected by the recording device 110 is analyzed to determine the slope of one or more portions of the substrate surface. The determined slope of the one or more portions of the substrate surface can then be used by the computing device 101 to determine the areas of the substrate surface that have a curvature that exceeds a desirable level and thus needs to be corrected by use of the a stress relief process or curvature correction process. A curvature correction process may include the delivery of a focused amount energy, or directing an ion beam or electron beam to a targeted region of the substrate based on the analysis performed by the computing device 101 based on the data found in the generated image.

Each set of wavefronts 162, 163 (e.g., $108a_{1a}$, $108b_{1a}$, $108c_{1a}$ and $108a_{1b}$, $108b_{1b}$, $108c_{1b}$) indicates surface topography of one direction (e.g., X direction or Y direction) across the substrate surface 122 where the light beam 104a, 104b, 104c is reflected from, so as to determine the local slope profile (e.g., topography or deflection profile) formed on the substrate surface 122. With the utilization of the beam displacing device 114 and the polarizer 112 to polarize and cause each sub-set wavefront 162, 163 that is reflected from different locations 151, 152, 153 of the surface 122 to interfere so that one can more accurately predict the local slope, stress or film topography in at least one direction.

As the configuration of the metrology system 100 depicted in FIG. 1 is relatively compact, utilizing of only a laser source 102, a pair of lens 118a, 118b, a beam displacing device, a polarizer 112, a computing device 101 and a recording device 110, the metrology system 100 can then be easily installed and integrated in a substrate processing system. By doing so, the substrate 120 may have a process performed thereon followed by the measurement in the metrology system 100, and then possibly perform a surface curvature correction on desired areas of the substrate which are defined by the metrology system 100, all at the same processing system, such as a system 500 depicted in FIG. 5 below, without breaking vacuum. Being able to process and measure the deformation of a substrate in one processing system may significantly reduce process cost, improve device yield and eliminate the likelihood of substrate contamination and environmental pollution that are required in conventional configurations that require two or more processing tools to perform these activities. Furthermore, the integration of the metrology tool and processing chambers in a processing system may also provide a feedback mechanism when a correction is immediately requested to improve results on the next wafer processed so as to provide multiple fast cycles of measurement and correction on the integrated processing system without delays that are often found from the conventional standalone metrology delays.

Figure 4:
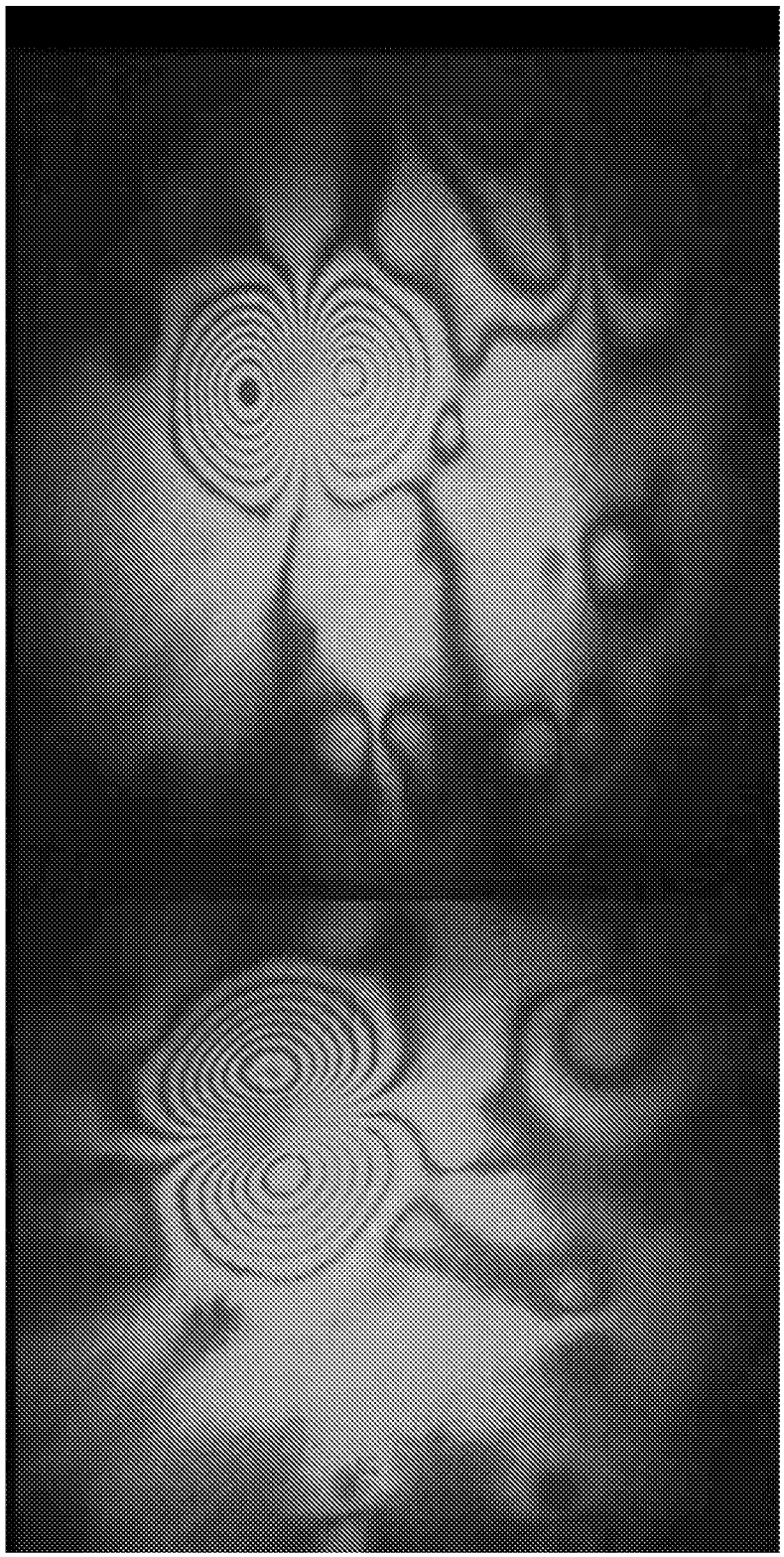
FIG. 4 depicts an image of the deflection of a substrate surface.

Referring first to FIG. 4, FIG. 4 depicts X and Y differential interference images of the wavefront reflected off from the substrate surface 122. The spacing between any two adjacent fringes is equivalent to a $2\pi$ differential phase shift. The patterned fringe structure, for example, illustrated in FIG. 4 arises due to the circular indentation generated by a vacuum suction device when the substrate was placed on a substrate support during a plasma process. The spatial shift due to the beam displacing device 114 in this example corresponded to 1 mm of the substrate surface and the field of view was 100 mm.

Figure 2:
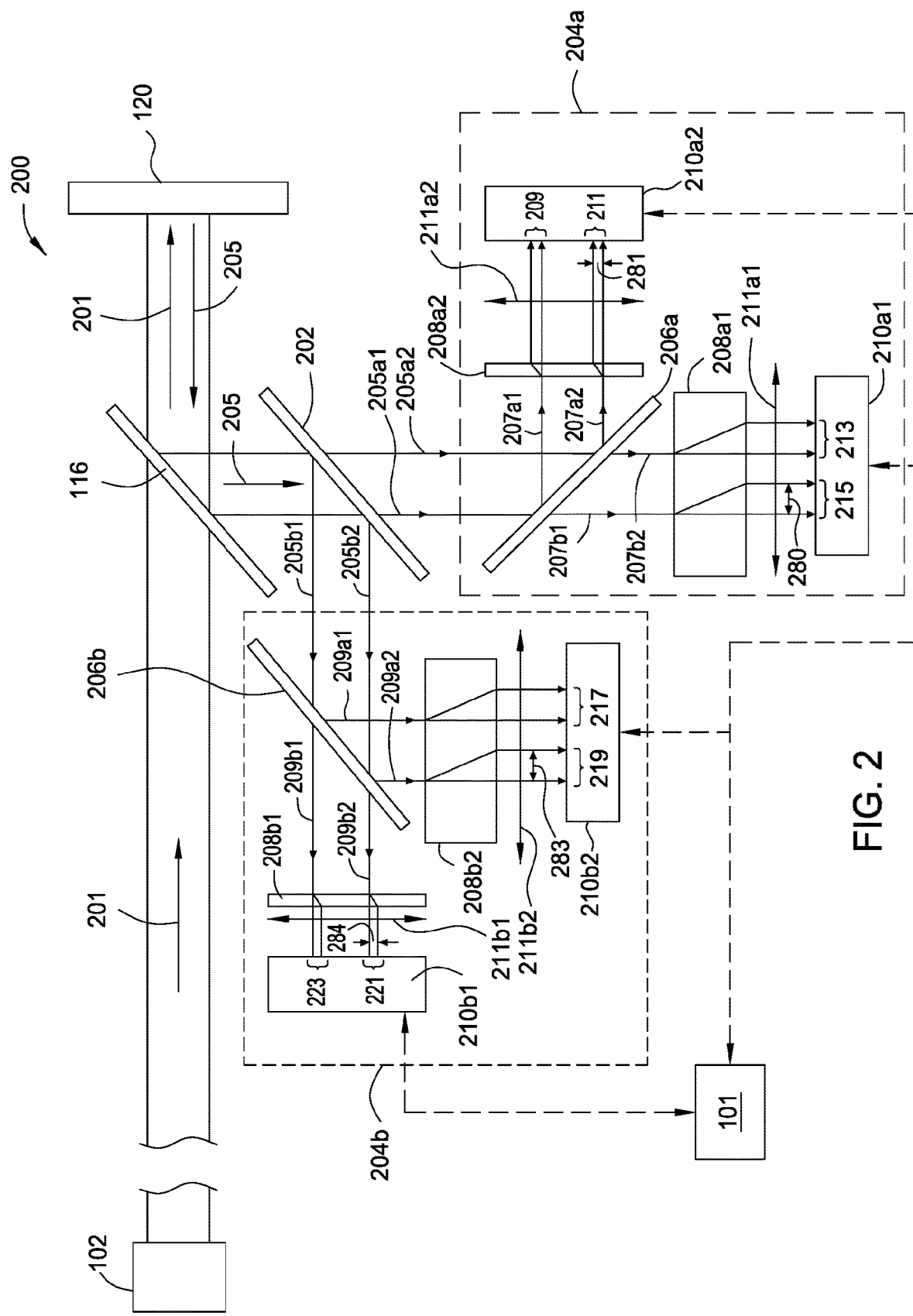
FIG. 2 depicts another embodiment of a metrology system to measure the deflection of a substrate.

FIG. 2 depicts another embodiment of the metrology system, such as metrology system 200, which is similarly constructed as metrology system 100, but contains two derivative modules 204a, 204b for measuring the deformed shape of the substrate in both the X and Y directions. Similar to the configuration to FIG. 1 stated above, the laser collimator 102 emits a light beam 201 toward the semiconductor substrate 120. A reflected light beam 205 is then generated from the reflection of the light beam 201 from the surface of the semiconductor substrate 120. The reflected light beam 205 then reaches the beam splitter 116 (e.g., a first beam splitter in the metrology system 200) and a portion of the reflected beam 205 is transferred to the detection section of the metrology system 200. In addition to the first light splitter 116, similarly configured in FIG. 1, a second beam splitter 202 is then further disposed after the light splitter 116 to split the portion of the reflected light beam 205 into two branches $205a_1$-$205a_2$, $205b_1$-$205b_2$ prior to entering into the Y derivative module 204a and the X derivative module 204b respectively. The second beam splitter 202 may be rotatable to direct the light beam 205 into different predetermined directions so that the light can be received and analyzed by the different modules 204a and 204b. Alternatively, the second beam splitter 202 may remain steady while a portion of the light beam 205 is directed to the X derivative module 204b while another portion of the light beam 205 passes through the second beam splitter 202 and enters the Y derivative module 204a.

After the light beam 205 enters the second beam splitter 202, the second beam splitter 202 directs the first light beam $205b_1$, $205b_2$ to the X derivative module 204b and directs the second light beam $205a_1$, $205a_2$ to the Y derivative module 204a.

Each derivative module, including the X and Y derivative modules 204a, 204b, includes a beam splitter 206a, 206b, a pair of beam displacing devices $208a_1$, $208a_2$, $208b_1$, $208b_2$, such as a calcite beam-displacer 114, a pair of polarizer $211a_1$, $211a_2$, $211b_1$, $211b_2$ (e.g., a polarizer 112) and a pair of recording devices $210a_1$, $210a_2$, $210b_1$, $210b_2$ that are coupled to the computing device 101. After the split light beams $205a_1$-$205a_2$, $205b_1$-$205b_2$ passes through or reflects from the second beam splitter 202, the split light beams $205a_1$-$205a_2$, $205b_1$-$205b_2$ then enter into the X and Y derivative modules 204b, 204a respectively. The split light beam $205a_1$-$205a_2$ enters into the Y derivative modules 204a and enters the beam splitter 206a, such as a third beam splitter, while the split light beam $205b_1$-$205b_2$ enters the X derivative modules 204b and enters the beam splitter 206b, such as a fourth beam splitter.

In the Y derivative modules 204a, the split light beam $205a_1$-$205a_2$ is further split into a first sub-set of light beams $207a_1$-$207a_2$, and a second sub-set of light beams $207b_1$-$207b_2$ prior to entering into the of beam displacing devices $208a_1$, $208a_2$ respectively. A portion of the split light beam $205a_1$-$205a_2$ then passes through the third splitter 206a to generate the second sub-set of light beams $207b_1$-$207b_2$ that is directed to the beam displacing device $208a_1$, while another portion of the split light beam $205a_1$-$205a_2$ is reflected back from the third splitter 206a to generate the first sub-set of light beams $207a_1$-$207a_2$ that is delivered to the beam displacing device $208a_2$. The beam displacing devices $208a_1$ and $208a_2$ and the polarizers $211a_1$ and $211a_2$ cause portions of the light beams $207a_1$-$207a_2$ and $207b_1$-$207b_2$ to interfere with each other, which is recorded and analyzed by their respective recording devices $210a_1$, $210a_2$, and the computing device 101.

Similarly, the reflected light beam $205b_1$-$205b_2$ is further split into a third sub-set of light beams $209a_1$-$209a_2$, and a fourth sub-set of light beams $209b_1$-$209b_2$ prior to entering the beam displacing devices $208b_1$, $208b_2$, respectively. A portion of the split light beam $205b_1$-$205b_2$ passes through the fourth splitter 206b to generate the fourth sub-set of light beams $209b_1$-$209b_2$ that is delivered to the beam displacing devices $208b_1$, while another portion of the split light beam $205b_1$-$205b_2$ is delivered to the fourth splitter 206b to generate the third sub-set of light beams $209a_1$-$209a_2$ that is delivered to the beam displacing device $208b_2$. The beam displacing devices $208b_1$ and $208b_2$ and the polarizers $211b_1$ and $211b_2$ cause the light beams $209a_1$-$209a_2$, and $209b_1$-$209b_2$ to interfere with each other, which is recorded and analyzed by their respective recording devices $210b_1$, $210b_2$, and the computing device 101.

By utilizing the X and Y derivative modules 204a, 204b in the metrology system 200, the reflected light beam 205 from the semiconductor substrate 120 may be further split into multiple light beams for collection and analysis. The multiple light beams may assist in analyzing and determining the substrate profile in different directions, at least in X and Y directions. In one example, in the X-direction derivative module 204a, the second sub-set light beam $207b_1$-$207b_2$ passes through the beam displacing devices $208a_1$ and the polarizers $211a_1$, further splitting the sub-set light beam $207b_1$-$207b_2$ into two light beams 215, 213 (e.g., two similar images) that are displaced with a first displacement 280 from each other. Similarly, also in a Y-direction derivative modules 204b, the third sub-set light beam $209a_1$-$209a_2$ passes through the beam displacing devices $208b_2$ and the polarizers $211b_2$, further splitting the sub-set light beam $209a_1$-$209a_2$ into two light beams 219, 217 that are displaced with a second displacement 283 from each other. By the selection of the width of the displacement 283, 280 formed between the light beams 219, 217, 215, 213, one can accurately detect the degree or gradient of the slope of a desirably sized region of the topography formed on the substrate surface. For example, the width of the displacement 283, 280 of the light beams 219, 217, 215, 213 generated in the derivative modules 204a, 204b is used to detect the slope of broader regions of the substrate surface versus detecting the slope of narrower or more localized regions of the substrate surface, which can be determined when a smaller displacement (e.g., displacement 284, 281) of the light beams 221, 223, 211, 209 is used, as created by the use of the other beam displacing devices $208b_1$ and $208a_2$, and its associated recording devices $210b_1$, $210a_2$. The light beams that have a similar displacement in the derivative modules 204a, 204b may be jointly analyzed or compared (such as the displacement 280, 283 or the displacement 281, 284 in the derivative modules 204a, 204b) by the computing device 101 to determine the slope of the topography formed on the substrate. In one example, the displacement 280, 283 from the derivative modules 204a, 204b respectively is analyzed jointly by the computing device 101 to determine the degree or gradient of the slope of a desirably sized region of the topography formed on the substrate surface in both X and Y directions. By doing so, curvatures formed on the substrate 120 may be more accurately analyzed to determine such curvature is a relatively small localized curvature or a global substrate curvature across the surface of the substrate 120. Different light beams 213, 215, 211, 209, 221, 223, 219, 217 from X and Y directions in each derivative modules 204a, 204b may generate displacement with different width so as to assist predicting the degree or gradient of the slope of the topography formed on the substrate 120 more precisely and determine the types of the curvature (e.g., global substrate curvature vs. localized small-size surface curvature) formed on the substrate 120. The analysis in at least two directions or more by the X and Y derivative modules 204a, 204b helps to more precisely build and detect the substrate topography and deflection distribution in two dimensions or even three dimensions as needed. Although only two derivative modules 204a, 204b are depicted in the metrology system 200, additionally derivative modules may be added or utilized as needed for different requirements or needs.

Figure 3:
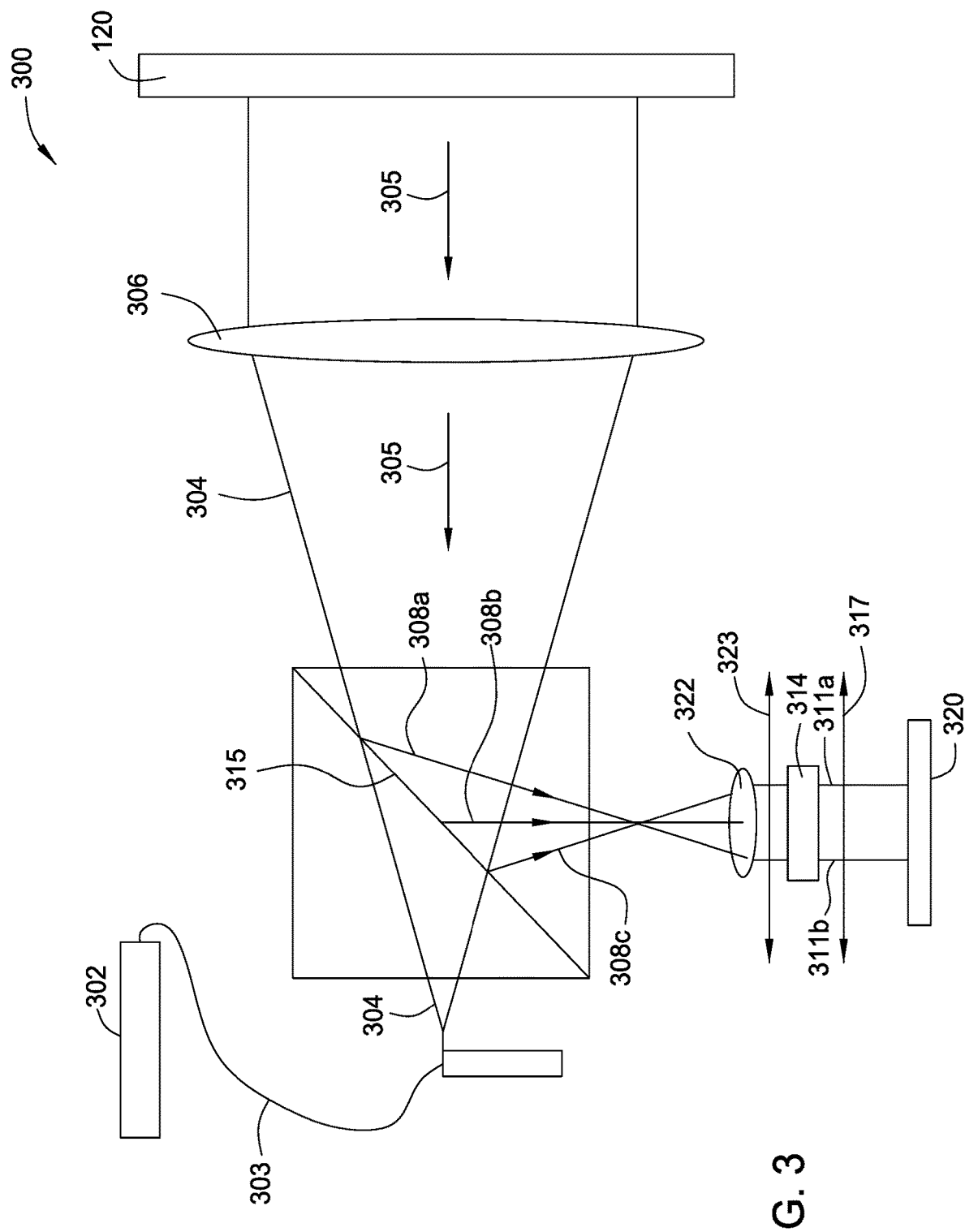
FIG. 3 depicts yet another embodiment of a metrology system to measure the deflection of a substrate.

FIG. 3 depicts yet another embodiment of a metrology system 300, which also utilized a differential wavefront interferometry measurement on the semiconductor substrate 120. The metrology system 300 includes a laser source 302 having a fiber 303 coupled thereto to generate a light beam 304 to the semiconductor substrate 120. The light beam 304 passes through a collimating lens 306 prior to reaching to the semiconductor substrate 120. After the light beam 304 reaches to the semiconductor substrate 120, a reflected light beam 305 is generated and reflected back to the collimating lens 306, along generally the same path that the light beam 304 went through. The reflected light beam 305 then reaches a beam splitter 315 that splits the reflected light beam 305 into one portion that forms the reflected light beams 308a, 308b, 308c. The reflected light beams 308a, 308b, 308c then pass through a beam displacing device 314, such as the calcite beam-displacer 114, which may split the light beam 308a, 308b, 308c into two or more un-polarized wavefronts 311a and 311b prior to entering into a polarizer 317. The polarizer 317 polarizes the wavefronts 311a and 311b and causes the wavefronts 311a and 311b to interfere with each other. The generated set of interfering wavefronts is then recorded by the recording device 320 and analyzed by the computing device. Another set of one or more collimating lenses 322 may be utilized prior to the beam displacing device 314 and the polarizer 317 to enhance the light beam split and interference.

In the example depicted in FIG. 3, where one collimating lens 306 is utilized, the metrology system 300, as compared to the metrology systems 100, 200 depicted in FIGS. 1 and 2, is more compact, less costly to manufacture and is easily constructed.

Figure 5:
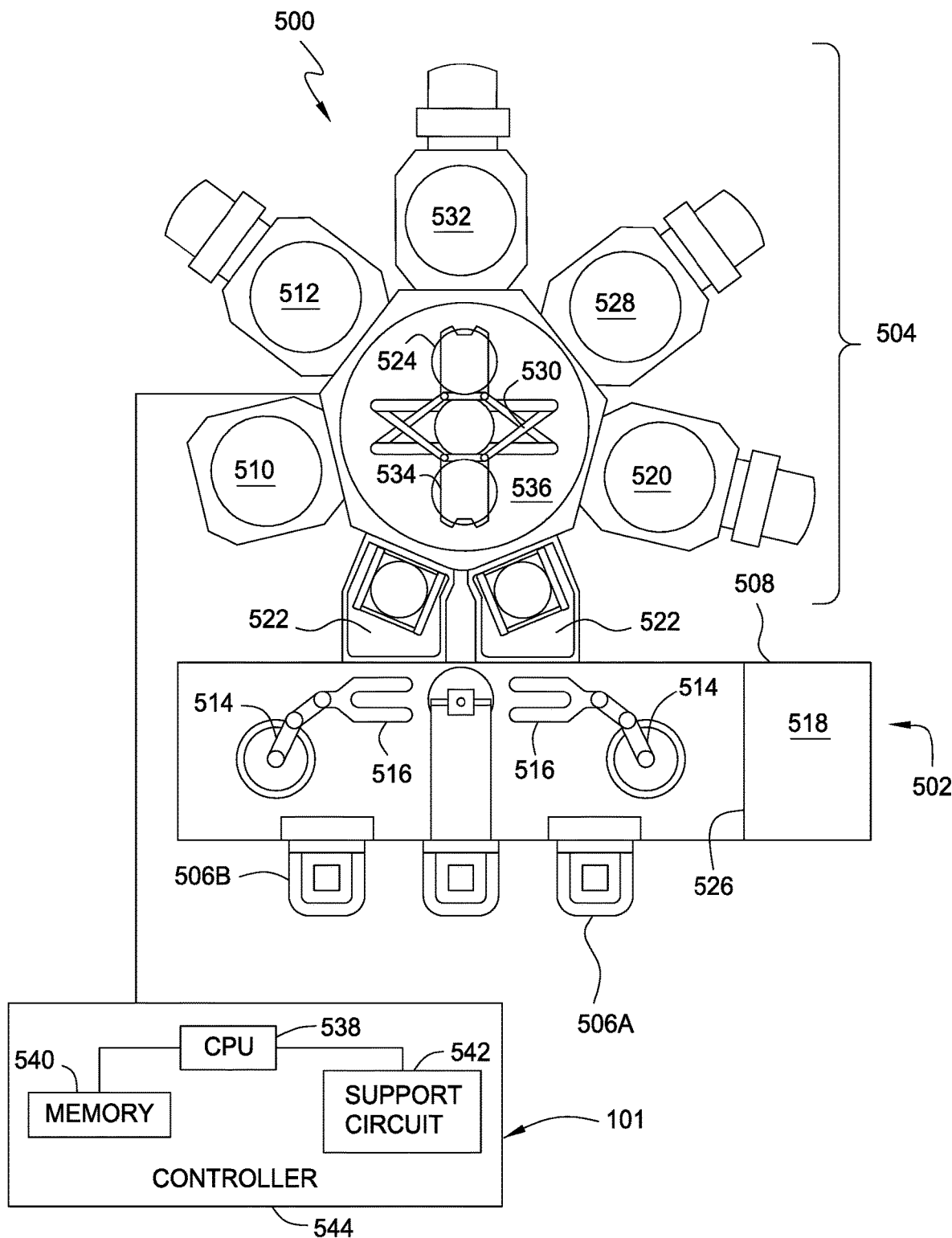
FIG. 5 depicts a schematic diagram of an exemplary processing apparatus that includes one embodiment of the metrology systems depicted in FIGS. 1-3 suitable for practice the present disclosure.

FIG. 5 is a schematic, top plan view of an exemplary processing system 500 that includes one or more of the metrology systems 100, 200, 300 illustrated in FIGS. 1-3 that are incorporated and integrated therein. In one embodiment, the processing system 500 may be a Centura® integrated processing system, commercially available from Applied Materials, Inc., located in Santa Clara, Calif. It is contemplated that other processing systems (including those from other manufacturers) may be adapted to benefit from the disclosure.

The system 500 includes a vacuum-tight processing platform 504, a factory interface 502, and a system controller 544. The platform 504 includes at least one metrology system 510, such as the one of the metrology systems 100, 200, 300 depicted from FIGS. 1-3, a plurality of processing chambers 512, 532, 528, 520 and at least one load-lock chamber 522 that is coupled to a vacuum substrate transfer chamber 536. Two load lock chambers 522 are shown in FIG. 5. The factory interface 502 is coupled to the transfer chamber 536 by the load lock chambers 522.

In one embodiment, the factory interface 502 comprises at least one docking station 508 and at least one factory interface robot 514 to facilitate transfer of substrates. The docking station 508 is configured to accept one or more front opening unified pod (FOUP). Two FOUPS 506A-B are shown in the embodiment of FIG. 5. The factory interface robot 514 having a blade 516 disposed on one end of the robot 514 is configured to transfer the substrate from the factory interface 502 to the processing platform 504 for processing through the load lock chambers 522. Optionally, one or more metrology stations 518 may be connected to a terminal 526 of the factory interface 502 to facilitate measurement of the substrate from the FOUPS 506A-B.

Each of the load lock chambers 522 have a first port coupled to the factory interface 502 and a second port coupled to the transfer chamber 536. The load lock chambers 522 are coupled to a pressure control system (not shown) which pumps down and vents the load lock chambers 522 to facilitate passing the substrate between the vacuum environment of the transfer chamber 536 and the substantially ambient (e.g., atmospheric) environment of the factory interface 502.

The transfer chamber 536 has a vacuum robot 530 disposed therein. The vacuum robot 530 has a blade 534 capable of transferring substrates 524 among the load lock chambers 522, the metrology system 510 and the processing chambers 512, 532, 528, 520.

In one embodiment of the system 500, the system 500 may include one or more metrology systems 510 (e.g., one or more of the metrology systems 100, 200, 300 depicted in FIG. 1-3) and at least one process chamber 512, 532, 528, 520, which may be a deposition chamber, etch chamber, thermal processing chamber (e.g., RTP chamber, laser anneal chamber) or other similar type of semiconductor processing chamber that may induce stress in a substrate during normal processing. In some embodiments of the system 500, one or more of metrology systems 510 may be disposed within one or more of the processing chambers 512, 532, 528, 520, the transfer chamber 536, the factory interface 502 and/or at least one of the load lock chambers 522.

The system controller 544 is coupled to the processing system 500. The system controller 544, which may include the computing device 101 or be included within the computing device 101, controls the operation of the processing system 500 using a direct control of the process chambers 512, 532, 528, 520 and the metrology system 510 of the system 500. Alternatively, the system controller 544 may control the computers (or controllers) associated with the process chambers 512, 532, 528, 520 and the metrology system 510 (e.g., computing device 101) and the system 500. In operation, the system controller 544 also enables data collection and feedback from the respective chambers and metrology system 510 to optimize performance of the system 500.

The system controller 544, much like the computing device 101 described above, generally includes a central processing unit (CPU) 538, a memory 540, and support circuit 542. The CPU 538 may be one of any form of a general purpose computer processor that can be used in an industrial setting. The support circuits 542 are conventionally coupled to the CPU 538 and may comprise cache, clock circuits, input/output subsystems, power supplies, and the like. The software routines transform the CPU 538 into a specific purpose computer (controller) 544. The software routines may also be stored and/or executed by a second controller (not shown) that is located remotely from the system 500.

Thus, embodiments of the disclosure provide several configurations of metrology systems that may be utilized to measure film stress, slope of the substrate surface and surface topography variations on the substrate surface, prior to and after a film layer is formed on the substrate. The metrology systems as disclosed herein are relatively compact relative to conventional metrology devices, due in at least part to the utilization of relatively simple optical elements. The compact size of the metrology systems may ease installation of the metrology systems in a manufacturing tool, such as a processing system, so as to save manufacturing cost and transportation time. Thus, a low cost and easily implemented metrology system is obtained to facilitate measurement of film stress, slope of surface of the substrate and surface topography variations on a substrate surface without adversely increasing manufacturing cycle time and cost.

While the foregoing is directed to embodiments of the present disclosure, other and further embodiments of the disclosure may be devised without departing from the basic scope thereof, and the scope thereof is determined by the claims that follow.

What is claimed is:

1. A metrology system, comprising:
   a laser source;
   a lens;
   a first beam splitter, wherein the lens is disposed between the laser source and the first beam splitter;
   a first beam displacing device that causes a portion of a light beam received from the beam splitter to be split into two or more sub-light beams that are displaced a distance apart from each other;
   a first recording device having a detection surface;
   a first polarizer that is positioned between the first displacing device and the first recording device, wherein the first polarizer causes the two or more sub-light beams provided from the first displacing device to form an interference pattern on the detection surface of the first recording device; and
   a second beam displacing device and a second polarizer consecutively positioned between the first polarizer and the first recording device.

2. The metrology system of claim 1, wherein the beam displacing device is a calcite beam-displacer.

3. The metrology system of claim 1, wherein the lens includes a pair of lenses that allow the light beam from the laser source to focus on a substrate disposed in the metrology system.

4. The metrology system of claim 1, wherein the first polarizer is positioned right in front of the recording device to allow the two or more sub-light beams to be received right after the light beam passes through the polarizer.

5. The metrology system of claim 1, further comprising:
   a second beam splitter positioned on a first optical path between the first splitter and the first beam displacing device.

6. The metrology system of claim 5, further comprising:
   a third beam splitter positioned on the first optical path between the second beam splitter and the first beam displacing device.

7. The metrology system of claim 6, further comprising:
   a second beam displacing device and a second polarizer adapted to receive the light beam transmitted or reflected from the third beam splitter.

8. The metrology system of claim 7, further comprising:
   a fourth beam splitter positioned on a second optical path between the second beam splitter and a third beam displacing device; and
   a third polarizer positioned to receive optical radiation delivered along the second optical path.

9. The metrology system of claim 8, wherein the third beam displacing device and the third polarizer receive the light beam transmitted or reflected from the fourth beam splitter.

10. The metrology system of claim 7, wherein the second beam displacing device and the second polarizer are adapted to receive the light beam split from the second beam splitter in an X or Y direction.

11. The metrology system of claim 7, further comprising:
    a second recording device adapted to receive an interference pattern created by optical radiation passing through the second polarizer.

12. The metrology system of claim 8, further comprising:
    a third recording device adapted to receive an interference pattern created by optical radiation passing through the third polarizer.

13. The metrology system of claim 1, wherein the laser source comprises a fiber coupled laser source.

14. The metrology system of claim 1, wherein the metrology system is disposed in a processing system, wherein the processing system has one or more processing chambers coupled thereto.

* * * * *